DRIFT-FREE D.C. AMPLIFIER

Filed June 1, 1962 2 Sheets-Sheet 1

INVENTOR:
John J. J. Staunton,
BY
Bair, Freeman & Molinare
ATTORNEYS.

DRIFT-FREE D.C. AMPLIFIER

Filed June 1, 1962 2 Sheets-Sheet 2

INVENTOR:
John J. J. Staunton,
BY
Bair, Freeman & Molinare
ATTORNEYS.

United States Patent Office 3,265,979

Patented August 9, 1966

3,265,979

DRIFT-FREE D.C. AMPLIFIER

John J. J. Staunton, Oak Park, Ill., assignor, by mesne assignments, to Coleman Instruments Corporation, Maywood, Ill., a corporation of Delaware Filed June 1, 1962, Ser. No. 199,342

9 Claims. (Cl. 330—9)

This invention relates generally to new and improved D.C. amplifier circuits and more particularly to a novel D.C. amplifier circuit having effectively drift-free characteristics.

It will be appreciated by those skilled in the art that amplifier stages which are used for the amplification or measurement of direct currents or voltages commonly are direct-connected. As such, the bias potential on each amplifier stage is dependent upon and is determined by the operating potentials of the preceding amplifier stage. As a result, the D.C. output level of any such amplifier stage will change if any of the significant operating potentials throughout the amplifier change.

In a measurement circuit, such as the type used in various electronic instruments for laboratory or other use, any such change in the D.C. output level can erroneously be interpreted as a change in the input signal potential being measured. Considerable effort has been expended in the prior art to minimize such erroneous measurements which result from changes in the amplifier operating potentials or from any source other than the input signal.

One common prior art approach has involved the regulation of power supply voltages and the use of elaborate circuits and selected components of high stability. Another approach towards the provision of a drift-free D.C. amplifier involves the conversion of the input D.C. signal to an A.C. signal and amplification thereof by an A.C. amplifier. This amplified signal then is rectified and restored to a D.C. level. Such systems, however, usually are quite expensive or have a rather low input impedance.

An additional approach of great value involves the use of negative feedback whereby the output of the amplifier is connected or referred back to its input in such a manner that as the output changes, the feedback tends to change the input so as to compensate for the output change. The elimination or suppression of amplifier drift by negative feedback, however, is subject to two important limitations. First, to approach one hundred percent feedback, which would most effectively reduce drift, normally requires a very high gain in the amplifier and therefore makes the amplifier more costly. Furthermore, even with nearly one hundred percent feedback, cyclical or erratic variations in the operating bias of the first stage amplifying tube or transistor, and to a lesser extent in subsequent stages, will appear as virtual changes in the input signal and therefore, cannot be compensated at all. Accordingly, even with the use of the best input tubes or transistors, which are the most critical components, and the use of a high gain negative feedback amplifier, in actual practice there still is amplifier drift with possible changes in the order of several millivolts referred to the input.

Accordingly, it is a general object of this invention to provide an effectively drift-free D.C. amplifier which overcomes the difficulties and limitations of the prior art apparatus.

It is a more specific object of this invention to provide an effectively drift-free D.C. amplifier characterized by its simplicity of construction and operation, its relatively low cost and its high input impedance.

It is another object of this invention to provide an improved D.C. amplifier having novel means for self-correction so as to make the amplifier effectively drift-free.

It is still another object of this invention to provide an improved and effectively drift-free D.C. amplifier which does not require the use of high-gain amplifier stages.

It is a further object of this invention to provide a new and improved D.C. amplifier wherein the degree of drift suppression can selectively be adjusted up to one hundred percent without affecting the measurement characteristics of the circuit.

It is a still further object of this invention to provide a new and improved effectively drift-free D.C. amplifier wherein the drift suppression is of a novel negative feedback type and is automatically self-regulating to the requirements of the circuit.

It is a still further object of this invention to provide a new and improved effectively drift-free D.C. amplifier of a negative feedback type comprising a memory capacitor and a switching system which serves to periodically disconnect the input signal from the amplifier to connect the amplifier input to a reference voltage point and to cause the memory capacitor to be charged from the amplifier output.

It is a still further object of this invention to provide a new and improved effectively drift-free D.C. amplifier which is highly suitable for use in measurement instruments, such as pH meters and the like, as well as in general purpose amplifying circuits.

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawing in which:

FIGURE 5 is a detailed schematic circuit diagram of a periodic self-correcting D.C. amplifier embodying the present invention as adapted for use in a measurement instrument, such as a commercial pH meter or the like.

Figure 1:
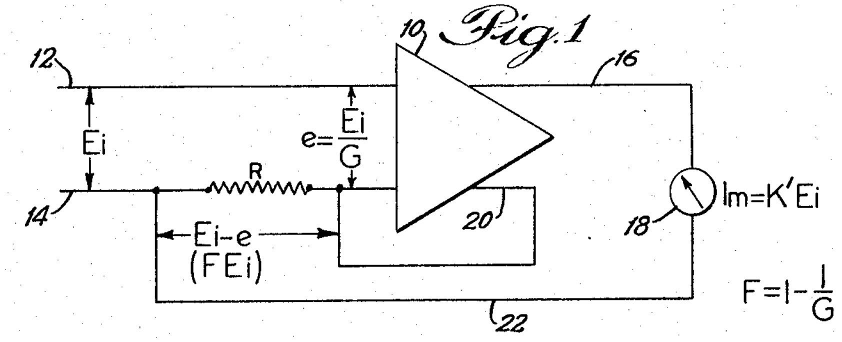
FIGURES 1 and 2 illustrate in diagrammatic form the principles of operation of a negative feedback amplifier circuit and a negative feedback amplifier circuit having a memory capacitor, respectively.

Referring now to the drawing, and more particularly to FIGURE 1 thereof, there is illustrated in diagrammatic form a D.C. amplifier circuit employing negative feedback of the type known in the prior art. Such a circuit comprises an amplifying portion 10, shown by its conventional symbol, which may take the form of one or more stages of any suitable amplifier employing electron tubes or semiconductor devices such as is well-known in the art. The input D.C. signal $E_i$ to the amplifier 10 is applied over a pair of input leads 12 and 14 which are connected to a suitable source of D.C. voltage to be amplified and/or measured. The input lead 12 is connected directly to the amplifier 10 while the input lead 14 is connected to the amplifier 10 through a suitable feedback resistance R. Also, as shown in FIGURE 1, an output lead 16 from the amplifier 10 is connected to a terminal of the indicating meter 18 the other terminal of which is connected by a feedback loop 22 to the junction of the feedback resistor R and the input lead 14. In addition, the remaining terminal of the feedback resistor R is connected directly by the common terminal 22 to the remaining input and output terminals of the amplifier 10.

Since the circuit of FIGURE 1 is a conventional negative feedback D.C. amplifier, those skilled in the art appreciate that the circuit will automatically adjust itself, assuming that we start from zero meter current when the D.C. input signal $E_i$ is equal to zero, so that an error voltage $e$ which is proportional to the D.C. input signal $E_i$ exists at the amplifier input. This gives rise to the relationship shown in FIGURE 1 wherein the voltage $e$ at the input of amplifier 10 may be represented as:

$$e=\frac{E_i}{G}$$

where G is the gain of the amplifier 10. Those skilled in the art appreciate that by choosing the proper value for the feedback resistance R, the voltage thereacross will be equal to $(E_i-e)$ or $FE_i$, for the chosen meter current $I_m$, where the F is the percentage feedback or feedback factor as shown by the equation:

$$F=1-\frac{1}{G}$$

The current through the meter 18 then is shown by the equation:

$$I_m=K'E_i$$

As indicated in FIGURE 1, the greater the gain G of the amplifier 10, the smaller the value of the error voltage $e$ will be.

It also will be appreciated by those skilled in the art that in the use of any practical or commercial D.C. amplifier, the assumption that is made hereinabove to the effect that $$I_m=0 \text{ for } E_i=0$$

will not persist for a very long time. After a period of use, any of a number of changes in the operating conditions in the amplifier 10 will occur to cause a drift which may be referred back to the input of the amplifier as an apparent voltage $E_d$, which is a voltage representing the drift of the amplifier. Under these conditions, the meter current $I_m$ will have changed by an amount equal to $K'E_d$. However, if a potential source is placed in the input lead 12 to the amplifier 10, and if it is adjusted to a potential equal to $-E_d$, this potential source will serve to cancel out the drift potential $E_d$ and the meter current $I_m$ will return to its correct value.

Figure 2:
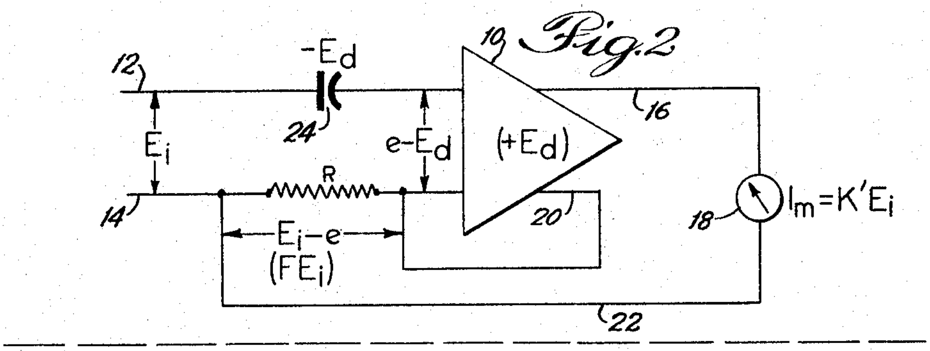

A circuit of the type known in the prior art for providing this function by the use of a potential source in the input lead is shown in FIGURE 2 of the drawing. As there shown, a memory capacitor 24 is connected between the input lead 12 and an input terminal of the amplifier 10. The remainder of the FIGURE 2 circuit is similar to the circuit shown in FIGURE 1 of the drawing and comprises the indicating meter 18, the feedback loop 20, and the feedback resistance R connected in the manner described hereinabove.

In summary of the above, after the practical D.C. amplifier has been operating for a period of time, various changes in its operating conditions will cause a drift which may be referred back to the amplifier input as an apparent voltage $E_d$. As shown in FIGURE 2, if the memory capacitor 24 serves as a potential source having a voltage equal to $-E_d$ thereacross, the memory capacitor potential will serve to cancel out the drift potential $E_d$, and the meter current $I_m$ will return to its original value of $K'E_i$.

Figure 3:
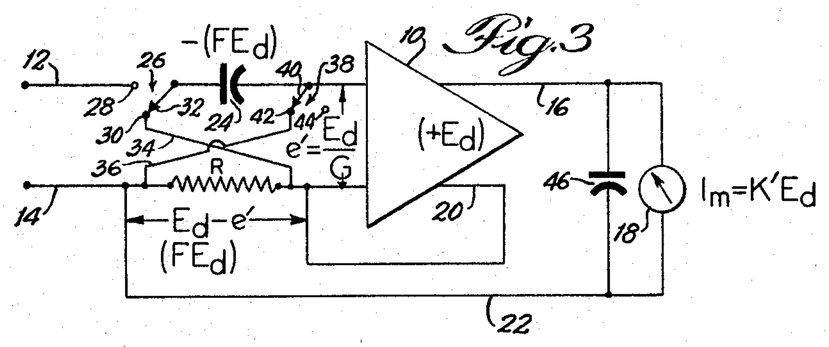
FIGURE 3 is a diagrammatic circuit of a periodic self-correcting D.C. amplifier embodying the present invention.

Referring now to FIGURE 3 of the drawing, there is shown a specific illustrative embodiment of the invention which is characterized by the use of a memory capacitor and a switching circuit effective to periodically switch the memory capacitor out of the amplifier input circuit and to place it across the feedback resistor so that the memory capacitor will be charged from the amplifier output. As shown in FIGURE 3, the input lead 12 is connected to a fixed contact 28 of switch 26, which further comprises a second fixed contact 30 and a movable contact or armature 32. The movable contact 32 is connected to the memory capacitor 24, which in turn, is connected to the input terminal of the D.C. amplifier 10. The fixed contact 30 of switch 26 also is connected through a connecting conductor 34 to a terminal of the feedback resistor R. In addition, a movable contact or armature 40 is connected to the memory capacitor 24 and the input terminal of amplifier 10, with the fixed contact 42 of switch 38 being connected by means of the connecting conductor 36 to the other terminal of the feedback resistor R. A second fixed contact 44 of switch 38 is left unconnected in the circuit.

In the operation of the circuit shown in FIGURE 3, it can be seen that the periodic actuation of switches 26 and 38 serves to disconnect the memory capacitor from the amplifier input circuit and to connect it across the feedback resistor R so that the memory capacitor will be charged from the amplifier output. Thus, when the switch operation returns the memory capacitor 24 back to the input circuit of the amplifier 10, the potential to which the memory capacitor has been charged serves to cancel out or compensate the effects of any drift which may have occurred in the amplifier.

The circuit of FIGURE 3 is shown with a pair of periodically operable switches 26 and 38 which advantageously may be ganged together for operation from a common operating source, or alternatively, may be operated from separate sources which are properly synchronized with each other. Those skilled in the art will appreciate that the switches 26 and 38 may be operated by any suitable electric motor, electric relay, or similar type of device suitable for actuating the movable armatures of the switches between the fixed contacts at the desired periodic or cyclic rate. Although the timing of the switch operation may be varied over wide limits within the principles of the invention, in a typical case with a 0.01 microfarad capacitor serving as the memory capacitor 24, the switching cycle may be repeated once or twice a second, with the charging period being in the range of 10 to 12 milliseconds. During this period, the inertia of the indicating meter 18 and the use of the shunt capacitor 46 thereacross prevents the meter pointer from twitching.

In the exemplary circuit of FIGURE 3, if the gain of the amplifier 10 is one thousand, the value of F, which stands for the feedback factor or percentage feedback, will be 0.999. As long as the drift potential $E_d$ is relatively small, compensation for such drift will be satisfactory. Thus, if the value $E_d$ becomes one hundred millivolts, which is quite possible, then the drift compensation would be 99.9 millivolts. If, on the other hand, the gain of the amplifier 10 is relatively low, such as a gain of one hundred, then the drift compensation for the circuit of FIGURE 3 would be 99.0 millivolts, leaving an error potential of one millivolt which in some circumstances might be objectionable.

Figure 4:
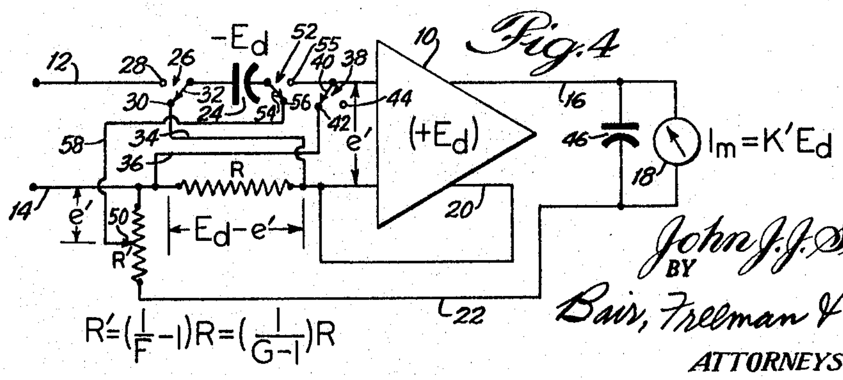
FIGURE 4 is a diagrammatic circuit of another embodiment of periodic self-correcting D.C. amplifier embodying the present invention.

This possibility of an objectionable error or drift potential in some application of a D.C. amplifier is eliminated in accordance with a further feature of this invention as illustrated in the circuit of FIGURE 4 of the drawing. From the detailed explanation given herebelow, it can be seen that the preferred embodiment shown in the FIGURE 4 drawing enables the memory capacitor 24 to be charged to the full value of drift potential $E_d$ to thereby achieve complete drift elimination.

As shown in FIGURE 4, the input lead 12 is connected to the input terminal of amplifier 10 through a pair of switches 26 and 52 respectively connected to opposite terminals of the memory capacitor 24. Thus, the input lead 12 is connected to the fixed contact 28 of switch 26 while the movable contact 32 of switch 26 is connected to the memory capacitor 24. The other fixed contact 30 of switch 26 is connected by the conductor 34 to a terminal of the feedback resistance R.

The movable contact 54 of switch 52 is connected to the other terminal of the memory capacitor 24 while its fixed contact 55 is connected to the input of amplifier 10. The remaining fixed contact 56 of switch 52 is connected by the conductor 48 to a sliding contact 50 of the potentiometric auxiliary resistance R′. Those skilled in the art will appreciate that the auxiliary resistance R′ in a practical embodiment may take the form of a fixed resistor of predetermined value, and that the potentiometer shown in FIGURE 4 is merely illustrative of this selectability.

In addition, the fixed contact 55 of switch 52 is connected to a movable contact 40 of switch 38, a fixed contact 42 of which is connected by the conductor 36 to the junction of the feedback resistance R and the auxiliary resistance R′ at the input lead 14. The remaining fixed contact 44 of switch 38 is unconnected in the circuit. The remainder of the circuit shown in FIGURE 4 is similar to that shown in FIGURE 3 with the exception that the conductor 22 from the indicating meter 18 is connected to the remaining terminal of the auxiliary resistance R′.

In the operation of the FIGURE 4 circuit, the switches are periodically actuated to disconnect the memory capacitor 24 from the amplifier input circuit, and to connect the charging conductor 58 of memory capacitor 24 to a selectable point on the auxiliary series resistance R′ in the output lead such that the circuit operation is represented by the following equation:

$$R'=\left(\frac{1}{F}-1\right)R=\left(\frac{1}{G-1}\right)R$$

Thus, it now will be appreciated that with the embodiment of FIGURE 4, the memory capacitor 24 will be charged to the correct voltage for proper drift compensation and will maintain the drift compensating voltage irrespective of the amount of the internal bias change, or drift, of the amplifier 10, and without the compensation potential being reduced by any error voltage $e'$. No drift then will appear in the output readings of the meter 18 for any internal amplifier drift, no matter how large, as long as the operating limits of the amplifier are not exceeded since the memory capacitor is charged to the true value of drift potential $E_d$.

An additional advantage of the FIGURE 4 circuit embodiment resides in the fact that this circuit does not require a high gain amplifier but will operate properly with a low gain amplifier as well as with a high gain amplifier. In addition, if the gain of the amplifier should change in the course of time, a simple adjustment of the sliding tap 50 on the auxiliary resistance R′ will restore the amplifier to the desired drift-free operation.

Figure 5:
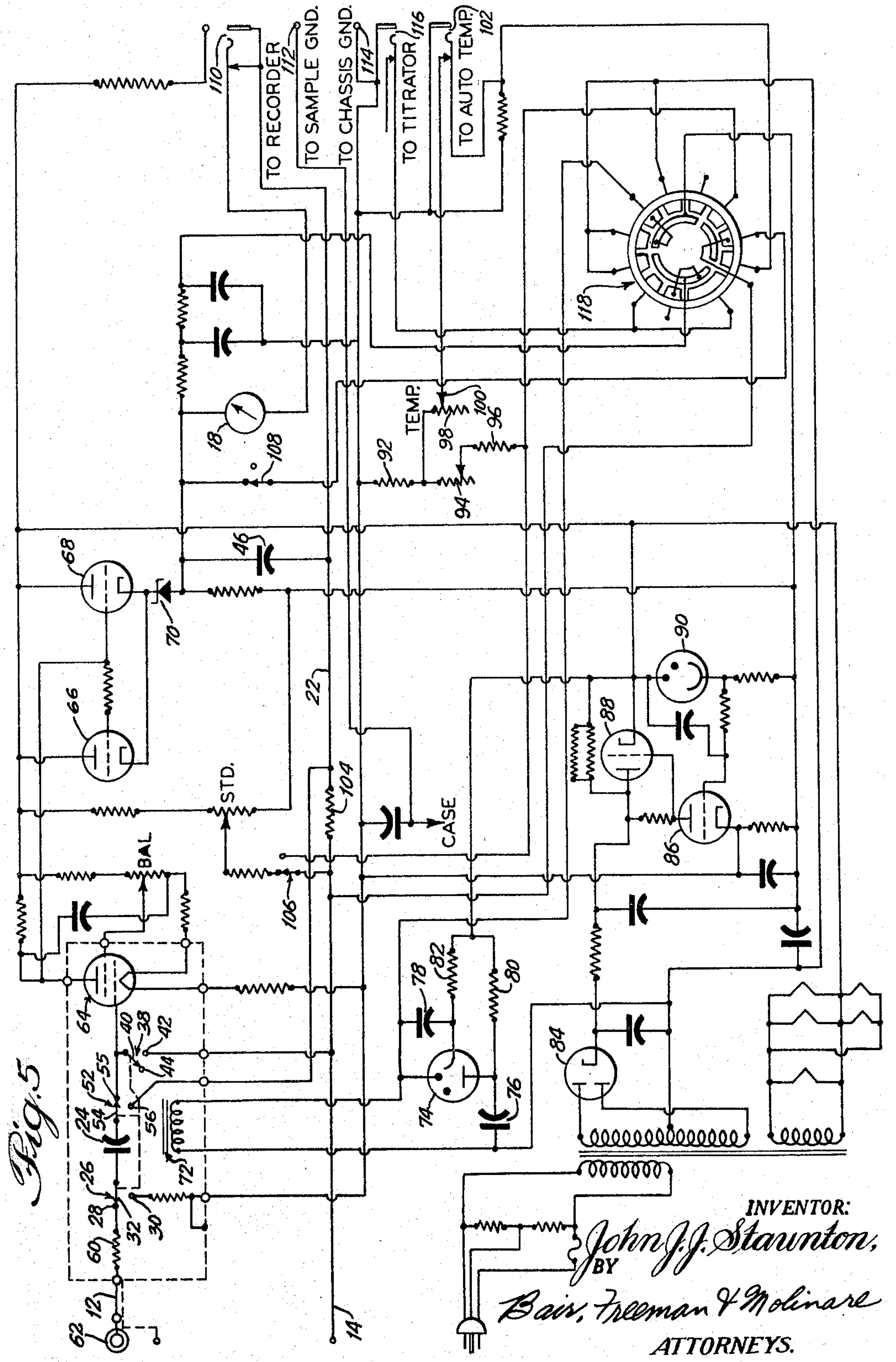

FIGURE 5 of the drawing represents a schematic or wiring diagram for one particular embodiment of the invention which advantageously finds use in a laboratory instrument, such as a commercial pH meter or the like. In this circuit drawing, the memory capacitor 24 is shown as connected through the contacts of switch 26 and at input resistance 60 to a source 62 of the D.C. input signal to be amplified and measured. The memory capacitor 24 also is connected through the contacts of switch 52 to the control grid of the first amplifier stage of the amplifier 10. In this particular embodiment, the amplifier comprises a first stage having the amplifying tube 64 followed by the triode tubes 66 and 68 connected as a paralleled cathode-follower. The output of the amplifier from the parallel cathodes of tubes 66 and 68 is taken through the Zener diode 70 to be applied to the indicating meter 18.

The switches 26, 52 and 38, as described above, in this specific embodiment advantageously have their movable contacts ganged together for synchronous operation for response to the periodic energization of the input relay 72. The winding of relay 72 is connected to a pulsing circuit comprising the trigger tube 74 in circuit with the capacitors 76 and 78, and the resistances 80 and 82 such that a series of periodic pulses are supplied at a desired frequency to the winding of input relay 72. This serves to periodically actuate the movable contacts of switches 26, 52 and 38 between their fixed contacts to perform the memory capacitor charging function described in detail hereinabove.

The rectifier tube 84, its associated filter circuit and the tubes 86, 88 and 90 at its output, comprises a regulated power supply for the drift-free amplifier circuit. Since the details of the regulated power supply do not form a specific feature of the present invention, and since many other types of regulated power supply may be used with the drift-free amplifier in lieu of the specific illustrative power supply shown in FIGURE 5 of the drawing, a further description of its operation is not necessary herein. It is believed that those skilled in the art can readily appreciate and understand its operation in supplying regulated voltage to the remaining components of the drift-free amplifier circuit.

The feedback resistance which serves to charge the memory capacitor 24 from the output of the amplifier in response to the operation of the switches 26, 52 and 38, is shown in the FIGURE 5 drawing by the resistors 92, 94, 96 and 98. These resistors serve as the feedback resistance R depending upon the operating range to which the instrument is switched. It will be noted that the resistor 98 may be varied as desired by the manual sliding tap 100 to provide temperature compensation, or if desired, automatic temperature compensation may be provided by connecting a suitable temperature responsive resistance device to the jack 102.

The auxilary series resistor R′ is shown in the FIGURE 5 drawing in the form of the resistance 104 which is connected to a fixed contact of the switch 38 in the manner described hereinabove. The circuit may be balanced by actuation of the balance switches 106 and 108 which enables the adjustment of the circuit when no D.C. input is being amplified and measured. This balancing operation is for the purpose of causing the indicating meter 18 to read near mid-scale when the memory capacitor is connected across the feedback resistor. The current passing through the conductor 22 during the charging of the memory capacitor will never be far from that current which passes while readings are being made. This reduces the tendency of the meter to twitch during switching and makes it easier for the capacitor 46 to hold the meter steady.

The illustrative schematic circuit of FIGURE 5 further shows a jack 110 which is adapted to be connected to a suitable recorder if the measurement of the D.C. input signal is to be applied thereto rather than indicated by the meter 18. Such recorders are well known to those skilled in the art, and are frequently used with pH meters and the like. The terminals 112 and 114 represent the sample ground and chassis ground terminals to insure that a common ground connection is provided between the measuring instrument and the D.C. input signal potential source. Since the illustrative circuit of FIGURE 5 is adapted to be used as a pH meter, provision is made for the connection of a titrator through the jack 116. Those skilled in the art will appreciate that the use of the illustrative drift-free D.C. amplifier for these various purposes may be effected by the multiple switch 118 shown in the circuit of FIGURE 5 as providing the necessary connections between the drift-free D.C. amplifier and the jacks for the associated equipment which is usable therewith.

In the operation of the illustrative circuit embodiment of FIGURE 5, it was found advantageous to sequence the switches 26, 52, and 38 in the memory capacitor circuit such that the memory capacitor 24 was connected to the feedback voltage by the switch 52 at a point in time later than the closure of the switch 38 which is connected to the control electrode of the input amplifying stage tube 64. Also, at least one of the two switches connecting the memory capacitor 24 to the feedback circuit, switches 26 and 52, should be sequenced to open at a point in time earlier than the opening of switch 38. Such sequencing can be effected by proper selection of the relay 72 and its associated contacts as is well known to those skilled in the art. In the use of a D.C. amplifier having drift-free characteristics and constructed in accordance with the illustrative circuit of FIGURE 5, it was found that the instrument was capable of measuring voltages in the order of a few hundred millivolts with an input impedance of about $10^{13}$ ohms and the stability over extended periods of time within a fraction of one millivolt.

While there has been shown and described a specific embodiment of the present invention, it will, of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. An improved periodically self-corrected drift-free D.C. amplifier circuit comprising D.C. amplifier means having pairs of input and output terminals, a signal input circuit having first and second circuit paths for applying a D.C. signal to the input terminals of said amplifier means, said first signal input circuit path comprising a memory capacitor connected to one input terminal of said amplifier means, and said second signal input circuit path comprising a feedback resistance connected to the second input terminal of said amplifier means, indicating means for the amplified D.C. signal connected to one output terminal of said amplifier means, a negative feedback loop connecting said indicating means to one terminal of said feedback resistance remote from said second input terminal, a common terminal connecting the other output terminal of said amplifier means and said second input terminal, and switching means for periodically switching said memory capacitor out of said first signal input path and across said feedback resistance to charge the memory capacitor from the amplifier output and then switching said memory capacitor back to said first signal circuit path to compensate for any drift in said amplifier means.

2. An improved periodically self-corrected drift-free D.C. amplifier circuit comprising D.C. amplifier means having pairs of input and ouput terminals, a signal input circuit having first and second circuit paths for applying a D.C. signal to the input terminals of said amplifier means, said first signal input circuit path comprising a memory capacitor connected to one input terminal of said amplifier means, and said second signal input circuit path comprising a feedback resistor connected to the second input terminal of said amplifier means, indicating means for the amplified D.C. signal connected to one output terminal of said amplifier means, a negative feedback loop connecting said indicating means to one terminal of said feedback resistor remote from said second input terminal, a common terminal connecting the other output terminal of said amplifier means and said second input terminal, and switching means for periodically switching said memory capacitor out of said first signal input circuit path and across said feedback resistor to charge the memory capacitor from the amplifier output and then switching said memory capacitor back to said first signal input circuit path to compensate for any drift in said amplifier means, said switching means comprising a first switch having a pair of fixed contacts respectively connected to said first signal input circuit path and to the terminal of said feedback resistor connected to said second input terminal, and a periodically movable contact connected to a terminal of said memory capacitor and alternately moved between said pair of fixed contacts, and further comprising a second switch having a fixed contact connected to the terminal of said feedback resistor connected to said indicating means, and a periodically movable contact connected to the other terminal of said memory capacitor and alternately moved on and off the last-named fixed contact.

3. An improved periodically self-corrected drift-free D.C. amplifier circuit in accordance with claim 2 further comprising switch actuating means operatively coupled to said switching means for moving said movable contacts of said first and second switch in synchronism with each other.

4. An improved periodically self-corrected drift-free D.C. amplifier circuit comprising D.C. amplifier means having pairs of input and output terminals, a signal input circuit having first and second circuit paths for applying a D.C. signal to the input terminals of said amplifier means, said first signal input circuit path comprising a memory capacitor connected to one input terminal of said amplifier means, and said second signal input circuit path comprising a feedback resistance connected to the second input terminal of said amplifier means, an auxiliary resistance of a predetermined value and having a pair of end terminals, one of said end terminals being connected to said feedback resistance at a terminal remote from said second input terminal, indicating means for the amplified D.C. signal connected to one output terminal of said amplifier means, a negative feedback loop connecting said indicating means to the other end terminal of said auxiliary resistance, a common terminal connecting the other output terminal of said amplifier means to said second input terminal, and switching means for periodically switching said memory capacitor out of said first signal input circuit path and across a circuit comprising said feedback resistance in series with said auxiliary resistance to charge the memory capacitor from the amplifier output, and then switching said memory capacitor back to said first signal input circuit path to compensate for any drift in said amplifier means.

5. An improved periodically self-corrected drift-free D.C. amplifier circuit comprising D.C. amplifier means having pairs of input and output terminals, a signal input circuit having first and second circuit paths for applying a D.C. signal to the input terminals of said amplifier means, said first signal input circuit path comprising a memory capacitor connected to one input terminal of said amplifier means, and said second signal input circuit path comprising a feedback resistance connected to a second input terminal of said amplifier means, indicating means for the amplified D.C. signal connected to one output terminal of said amplifier means, a negative feedback loop connecting said indicating means to one terminal of said feedback resistance remote from said second input terminal, a common terminal connecting the other output terminal of said amplifier means and said second input terminal, and switching means for periodically switching said memory capacitor out of said first signal input circuit path and across said feedback resistor to charge the memory capacitor from the amplifier output and then switching said memory capacitor back to said first signal input circuit path to compensate for any drift in said amplifier means, said switching means comprising an electrically energizable relay adapted to be energized to effect the switching operation, and means for periodically applying energizing signals to said relay at the desired switching frequency rate.

6. The improvement of a periodically self-corrected drift-free D.C. amplifier circuit comprising the combination of a D.C. amplifier having a pair of input terminals and a pair of output terminals, a pair of input leads for applying a D.C. signal to be amplified to said D.C. amplifier, memory capacitor means connected by one of said input leads to one of said amplifier input terminals, feedback resistance means connected by the other input lead to the other amplifier input terminal, indicating means for providing an indication of the amplified D.C. signal and having a pair of terminals, output conductor means connecting one of said amplifier output terminals to a terminal of said indicating means, feedback means connecting the other terminal of said indicating means to the terminal of said feedback resistance means remote from said other amplifier input terminal, common terminal means connecting said other amplifier input terminal to the other amplifier output terminal, and repetitively operable switching means operable to periodically disconnect said one input lead from said memory capacitance means and to connect said memory capacitance means across said feedback resistance means for causing said memory capacitance means to be charged from the output of said amplifier.

7. The improvement of a periodically self-corrected drift-free D.C. amplifier circuit comprising the combination of a D.C. amplifier having a pair of input terminals and a pair of output terminals, a pair of input leads for applying a D.C. signal to be amplified to said D.C. amplifier, memory capacitor means connected by one of said input leads to one of said amplifier input terminals, feedback resistance means connected by the other input lead to the other amplifier input terminal, auxiliary resistor means connected to a terminal of said feedback resistance means remote from said other amplifier input terminal, indicating means for providing an indication of the amplified D.C. signal and having a pair of terminals, output conductor means connecting one of said amplifier output terminals to a terminal of said indicating means, feedback means connecting the other terminal of said indicating means to a terminal of said auxiliary resistance means remote from said feedback resistance means, common terminal means connecting said other amplifier input terminal to the other amplifier output terminal, and repetitively operable switching means operable to periodically disconnect said one input lead from said memory capacitance means and to connect said memory capacitance means across a circuit comprising said feedback resistance means in series with a selected portion of auxiliary resistance means for causing said memory capacitance means to be charged from the output of said amplifier.

8. The improvement of a periodically self-corrected drift-free D.C. amplifier circuit comprising the combination of a D.C. amplifier having a pair of input terminals and a pair of output terminals, a pair of input leads for applying a D.C. signal to be amplified to said D.C. amplifier, memory capacitor means connected by one of said input leads to one of said amplifier input terminals, feedback resistance means connected by the other input lead to the other amplifier input terminal, indicating means for providing an indication of the amplified D.C. signal and having a pair of terminals, output conductor means connecting one of said amplifier output terminals to be a terminal of said indicating means, feedback means connecting the other terminal of said indicating means to a terminal of said feedback resistance means remote from said other amplifier input terminal, common terminal means connecting said other amplifier input terminal to the other amplifier output terminal, repetitively operable switching means operable to periodically disconnect said one input lead from said memory capacitance means and to connect said memory capacitance means across said feedback resistance means for causing said memory capacitance means to be charged from the output of said amplifier, and a source of cyclically occurring signals connected to said switching means for causing the latter to be actuated at a desired repetitive switching rate.

9. An improved periodically self-corrected drift-free D.C. amplifier circuit comprising a D.C. amplifier having pairs of input and output terminals, a signal input circuit having first and second signal input circuit paths for applying a D.C. signal to the input terminals of said D.C. amplifier, said first signal input circuit path comprising a D.C. storage device connected to one amplifier input terminal, and said second signal input circuit path comprising feedback means having one end commonly connected to the other amplifier input terminal and to one amplifier output terminal, feedback means connecting the other amplifier output terminal to the other end of said feedback means, and switching means connected to said D.C. storage device and to said feedback means for periodically switching said D.C. storage means out of said first signal input circuit path and in parallel with said feedback means to apply the D.C. amplifier output to said D.C. storage means to return the D.C. amplifier to a condition of zero input, and for then switching said D.C. storage means from said feedback means back to said first signal input circuit path to compensate for any drift in said D.C. amplifier.

References Cited by the Examiner

UNITED STATES PATENTS

| | | | |
|---|---|---|---|
| 2,709,205 | 5/1955 | Colls | 330—9 |
| 2,724,022 | 11/1955 | Williams et al. | 330—9 X |
| 2,895,105 | 7/1959 | Sontheimer | 324—123 X |
| 2,937,369 | 5/1960 | Newbold et al. | 324—123 X |
| 2,940,043 | 6/1960 | Nagy | 324—123 X |

ROY LAKE, *Primary Examiner.*

NATHAN KAUFMAN, *Examiner.*